United States Patent [19]

Masuda

[11] 3,940,554
[45] Feb. 24, 1976

[54] AUTOMATIC FREQUENCY CONTROL DEVICE FOR TELEVISION RECEIVER

[75] Inventor: Mitsuya Masuda, Ibaraki, Japan

[73] Assignee: Matsushita Electric Industrial Co., Ltd., Japan

[22] Filed: Aug. 2, 1974

[21] Appl. No.: 494,091

[30] Foreign Application Priority Data
Aug. 16, 1973 Japan.............................. 48-92192
Oct. 17, 1973 Japan.............................. 48-117227

[52] U.S. Cl............................ 178/5.8 AF; 325/420
[51] Int. Cl.²........................................ H04N 5/50
[58] Field of Search....... 178/5.8 AF; 325/423, 422, 325/420

[56] References Cited
UNITED STATES PATENTS
3,584,141 6/1971 Fujiwara et al...................... 325/422
3,858,000 12/1974 Merriweather et al......... 178/5.8 AF

OTHER PUBLICATIONS

Lavender, Automatic Frequency Control, RCA Technical Notes TN No. 348, Nov., 1959.

Primary Examiner—George H. Libman
Attorney, Agent, or Firm—Burgess Ryan and Wayne

[57] ABSTRACT

An automatic frequency control device is disclosed wherein the S-shaped waveform character voltage derived by the FM detection of the video intermediate frequency signal is applied to a local oscillator so as to correct its oscillation frequency. The S-shaped waveform character voltage is corrected in response to the output voltage derived by the detection of the sound carrier of the adjacent receiving channel so that the pull-in range may be increased.

6 Claims, 6 Drawing Figures

FIG. 2
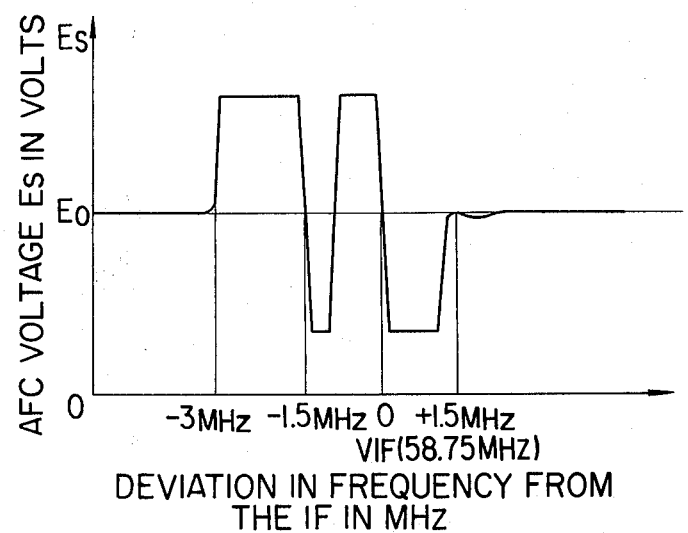
FIG. 6
(a)
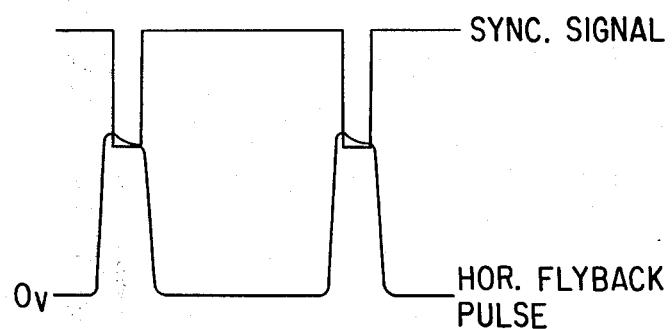
(b)
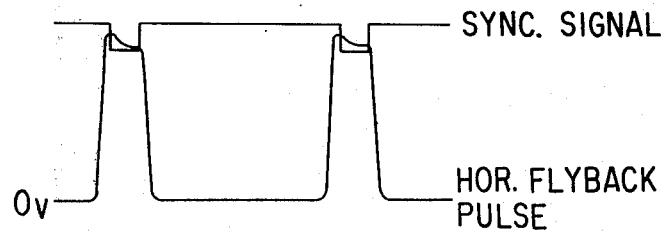

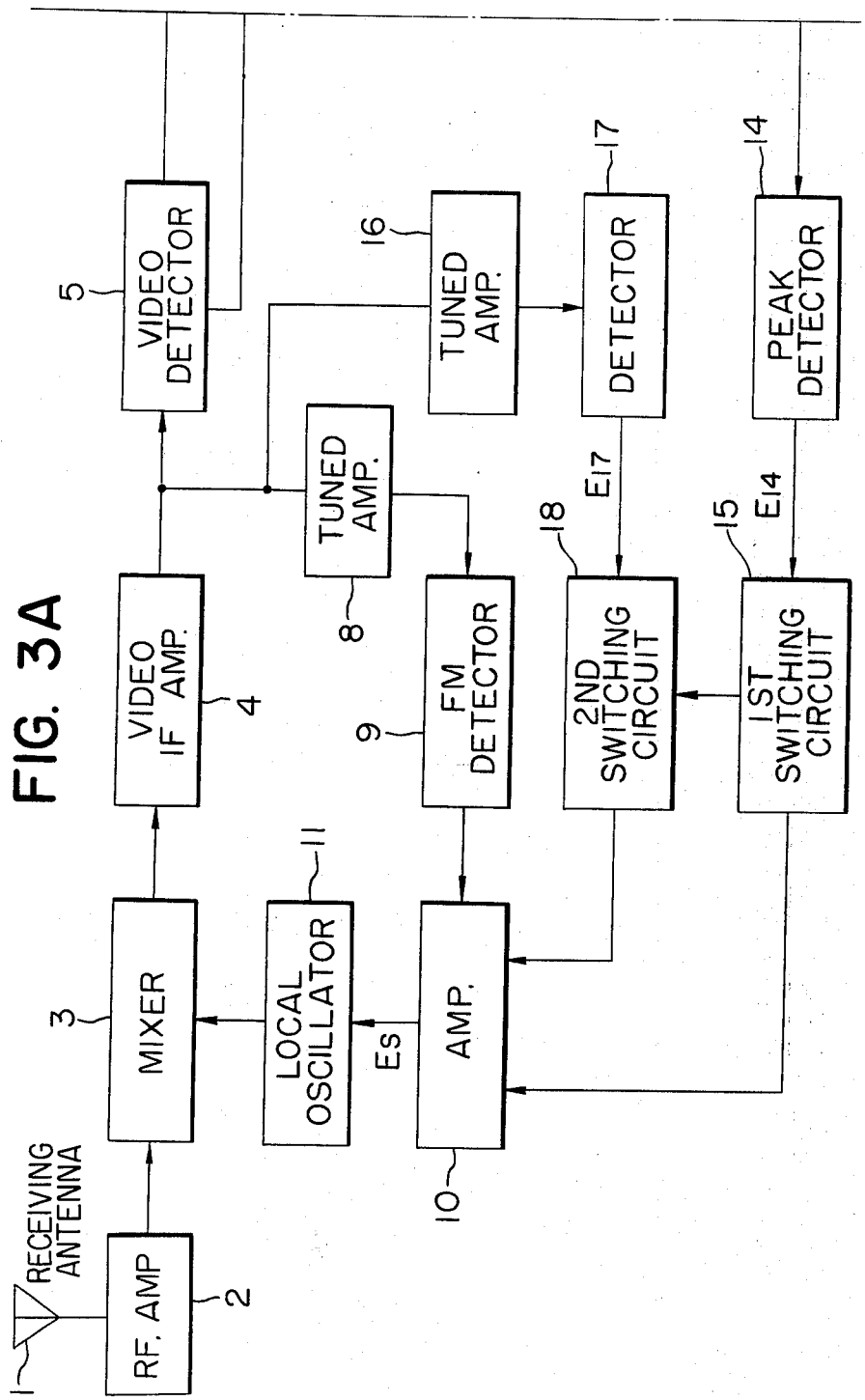

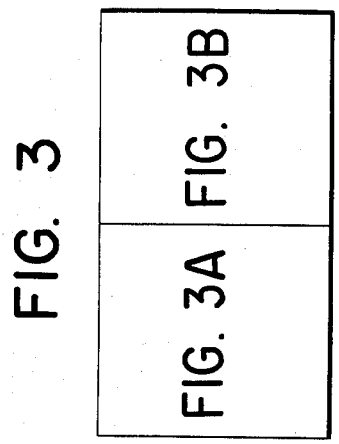
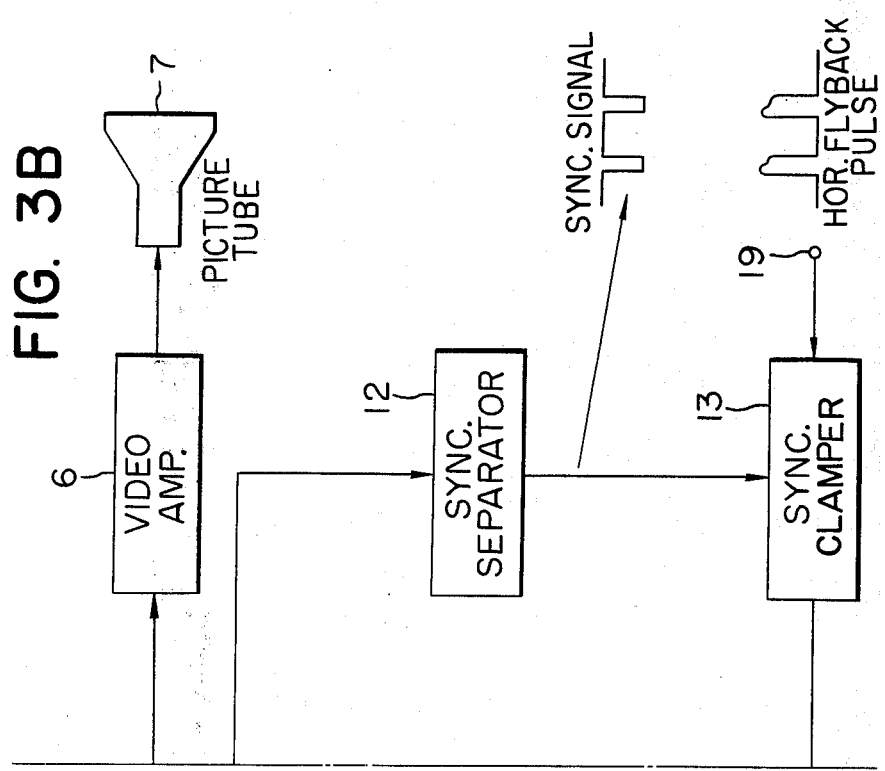

AUTOMATIC FREQUENCY CONTROL DEVICE FOR TELEVISION RECEIVER

BACKGROUND OF THE INVENTION

The present invention generally relates to an automatic frequency control device which will not pull in the sound carrier in the adjacent receiving channel.

There has been known an automatic frequency control device for a television receiver of the type in which the oscillation frequency of a local oscillator is corrected in response to the output voltage derived by the FM detection of the video intermediate frequency signal.

However, the prior art automatic frequency control device of the type described has some defects. Firstly, it tends to pull in the sound carrier of the adjacent receiving channel because the inversed S-shaped character voltage is induced by the sound carrier of the adjacent receiving channel when the electric intensity thereof is high; when the oscillation frequency of the local oscillator is too low or deviates to a lower frequency by about 1.5 MHz. Secondly, when the oscillation frequency is too high or deviates to a higher frequency by more than 1.3 MHz, the video carrier drops at or in the proximity of the tuning frequency of 60.25 MHz of a sound carrier trap for the adjacent receiving channel so that the upper pull-in range is limited only to about 1.3 MHz. As a result, the erratic operations tends to occur very often.

SUMMARY OF THE INVENTION

One of the objects of the present invention is therefore to substantially eliminate the defects encountered in the prior art automatic frequency control devices of the type described above.

Another object of the present invention is to provide an automatic frequency control device especially adapted for use with television receivers and capable of preventing the pull-in of the aural or sound carrier of the adjacent receiving channel even when the deviation of the oscillation frequency of the local oscillator occurs.

A further object of the present invention is to provide an automatic frequency control device with an increased pull-in range so that the stabilized operation of a television receiver may be ensured.

BRIEF DESCRIPTION OF THE DRAWING

FIG. 2 is a view used for the explanation of the defects thereof;

FIG. 3 is a block diagram of one preferred emodiment of the present invention;

FIG. 6 is a view used for the explanation of the mode of operation of a clamping circuit thereof.

The same reference numerals are used to designate similar parts throughout the drawings.

DESCRIPTION OF THE PREFERRED EMBODIMENT

Figure 1:
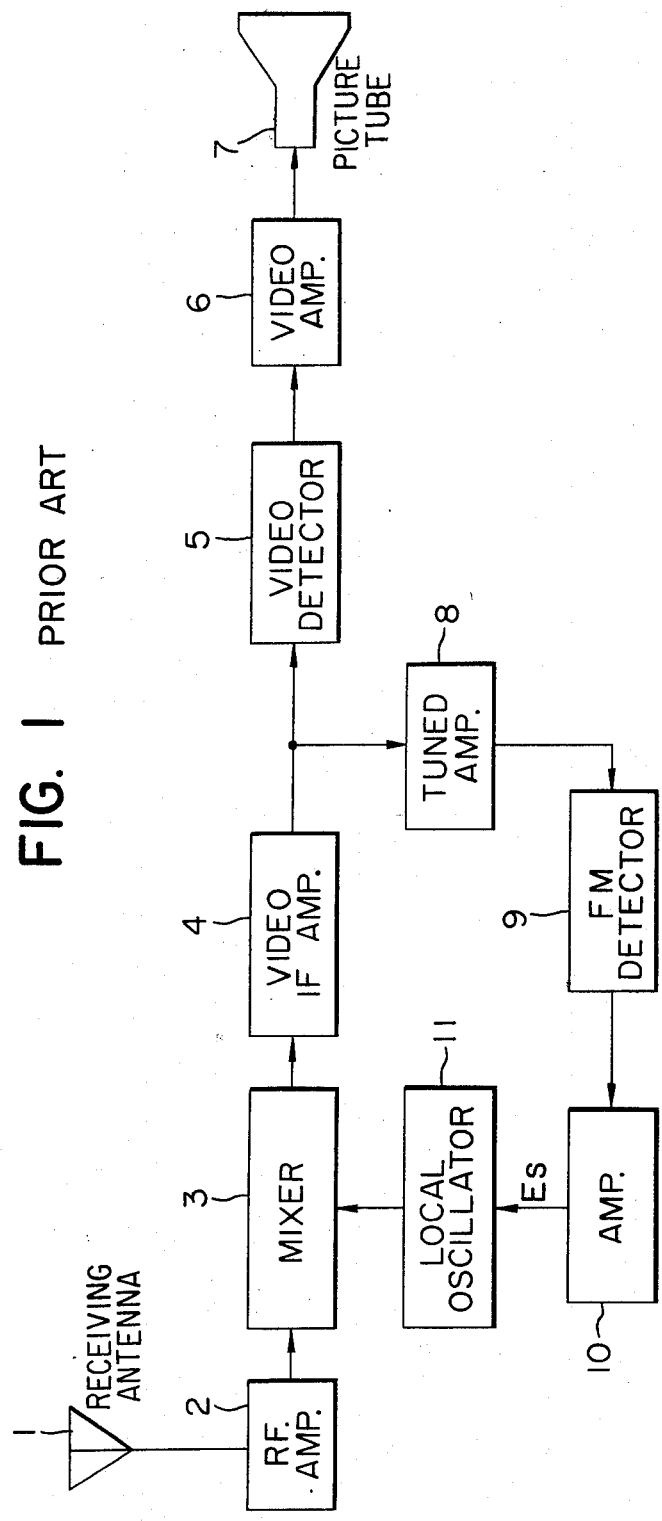
FIG. 1 is a block diagram of one example of the prior art automatic frequency control devices for television receivers.

Prior Art, FIGS. 1 and 2

Prior to the description of the preferred embodiment of the present invention, one example of the prior art automatic frequency control device to be referred to as the "AFC device" hereinafter for brevity in this specification will be described briefly in order to specifically point out the problems thereof.

Referring to FIG. 1 illustrating in block diagram of one prior art AFC device for a television receiver, the television signal intercepted by a receiving antenna 1 is amplified by a radio-frequency amplifier 2, the output of which is coupled to a mixer 3 to which is also coupled the output of a local oscillator 11 so that it is converted into the intermediate frequency signal to be referred to as the "IF signal" hereinafter for brevity in this specification. The output of the mixer 3 is coupled through a video IF amplfier 4, a video detector 5, and a video amplifier 6 to a picture tube 7. The output of the video IF amplifier 4 is also coupled through a tuned amplifier 8 (which is tuned to the video IF) to an FM detector such as a ratio detector whose output is coupled through an amplifier 10 to the local oscillator 11. More particularly, the inverse S-shaped waveform output voltage of the amplifier 10 is applied to a varactor diode in the local oscillator 11 so that the output frequency thereof to be applied to the mixer 3 may be automatically corrected. In other words, the automatic frequency control device of the type described provides a feedback system so that the video IF signal may be maintained at a specific frequency.

However, when the oscillation frequency of the local oscillator 11 decreases or deviates by −1.5 MHz when the electric field of the next channel is strong, an inverse S-shaped waveform character voltage is produced by the sound carrier of the next channel so that the AFC device pulls in the sound carrier, thus resulting in the erratic operation.

The prior AFC device of the type described has another undesirable feature that when the oscillation frequency of the local oscillator 11 increases or deviates by more than +1.3 MHz to a higher frequency, the video signal carrier drops at the tuning frequency of 60.25 MHz of a sound take-off trap for the next channel. Therefore the upper range of the inversed S-shaped character voltage is limited within +1.3 MHz so that the upper pull-in range is also limited within about 1.3 MHz.

In summary, the prior art AFC device of the type described has the two distinct undesirable features that the sound carrier in the adjacent channel is pulled in so that the erratic operation tends to occur very often and that the pull-in range, especially the upper pull-in range is very limited.

The Invention, FIGS. 3 – 6

Referring to FIGS. 3 through 6 the preferred embodiment of the present invention will be described in detail hereinafter. Referring first to FIG. 3, the output of the video detector 5 is coupled to a sync separator 12 so as to separate the sync signals from the composite picture signal. The sync signals applied from the separator 12 to a sync signal clamper 13 are clamped by the horizontal flyback pulses applied to an input terminal 19. The output of the sync signal clamper 13 is coupled to a peak detector 14 which detects the clamped sync pulses, and the output E14 of the peak detector 14 is coupled to a first switching circuit 15.

Figure 4:
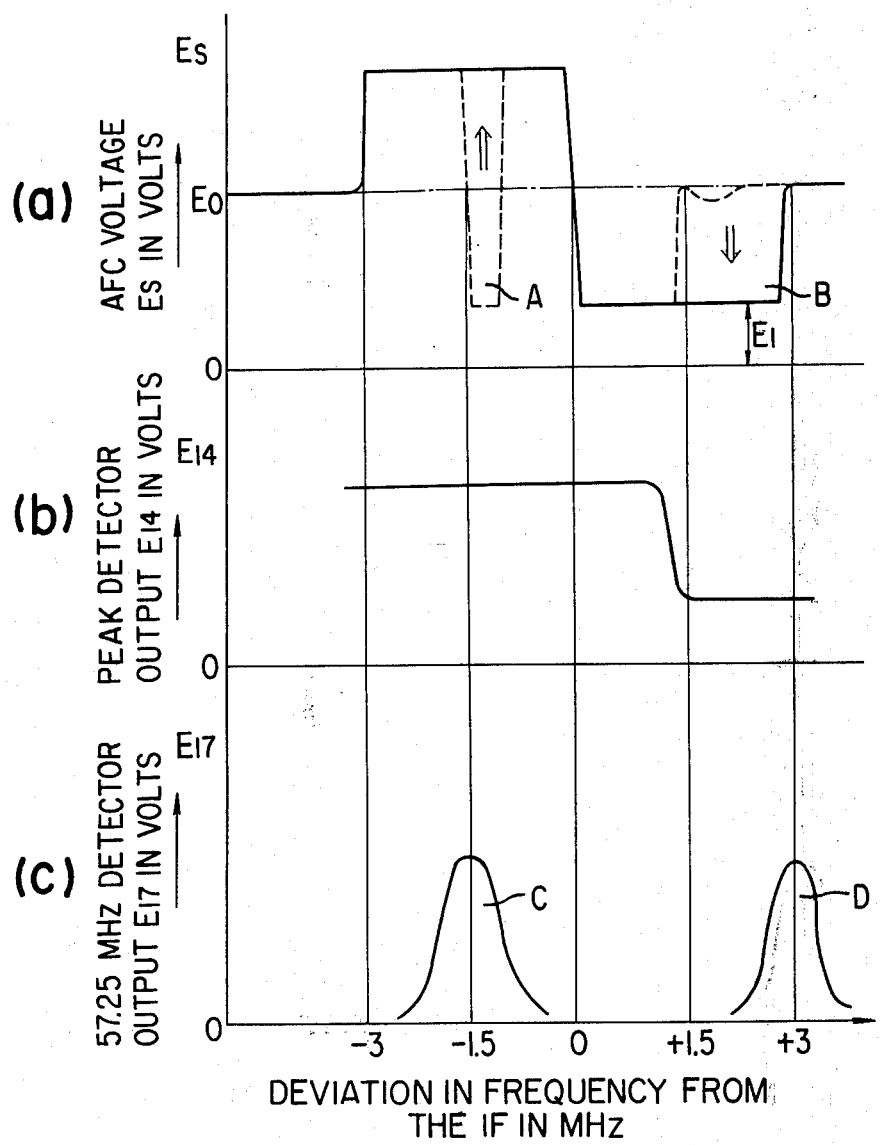
FIG. 4 is a view used for the explanation of the mode of operation thereof.

The effect of the output voltage E14 of the peak detector 14 upon the deviation of the oscillation frequency $f_{LO}$ of the local oscillator 11 is shown in FIG. 4 at (b), in which the deviation in frequency from the reference video intermediate frequency (= 58.75 MHz) is plotted along the abscissa. When the deviation of the oscillation frequency $f_{LO}$ is 1.0 MHz higher than the reference frequency, the sync pulses are reduced or elminated by the sound-take-off trap so that the output voltage E14 drops. When the oscillation frequency $f_{LO}$ is precisely tuned to the reference frequency or it deviates to a lower frequency, the output voltage E14 rises because the normal sync signals are derived. Therefore, the output voltage E14 is stepped down from a frequency about 1.5 MHz higher than the reference frequency as shown in FIG. 4b.

Referring back to FIG. 3, in response to the output voltage E14 of the peak detector 14, the switching circuit 15 is actuated so that the output voltage $E_S$ of the AFC device may have a waveform indicated by the solid lines B in FIG. 4a. The waveform obtained by the prior art device is indicated by the broken lines. Thus, it is seen that the pull-in range of the AFC device in accordance with the present invention has a wider upper range extending over about 3 MHz from the reference frequency.

The output of the video IF or common amplifier 4 is also coupled to a tuned amplifier 16 tuned to 57.25 MHz, and the output of the tuned amplifier 16 is coupled to a detector 17 for detecting the frequency of 57.25 MHz. The output E17 of the detector 17 is shown in FIG. 4c. That is, when the oscillation frequency $f_{LO}$ deviates to a lower frequency by 1.5 MHz, 58.75 MHz (the video IF) − 1.5 MHz = 57.25 MHz is detected. Therefore the inversed V-shaped output voltage E17 is obtained as shown at C in FIG. 4c. On the other hand, when the oscillation frequency $f_{LO}$ deviates to a higher frequency by 3 MHz, the 54.25 MHz (sound IF) + 3 MHz = 57.25 MHz is detected so that the output voltage is derived as shown in FIG. 4c at D. In summary, when the oscillation frequency $f_{LO}$ deviates to a lower or higher frequency, the inverted V-shaped output voltage E17 centered at 57.25 MHz is detected as shown in FIG. 4c, and in response to this output voltage E17, a second switching circuit 18 (see FIG. 3) is actuated.

When the oscillation frequency $f_{LO}$ deviates to a lower frequency by 1.5 MHz, it would tend to be pulled in by the sound carrier in the next channel, but at this instant, according to the present invention, the video carrier is 57.25 MHz and the high output voltage E17 is derived from the detector 17. Therefore the switching circuit 18 is turned on so that the output voltage $E_S$ of the AFC device may have a waveform (B) as shown in FIG. 4a. Thus the AFC circuit is prevented from pulling in the sound carrier in the next channel. The output of the first switching circuit 15 is also coupled to the second switching circuit 18 so that in response to the output of the switching circuit 15 the second switching circuit 18 is turned off when the local oscillation frequency $f_{LO}$ deviates to a higher frequency by 3 MHz. Thus, the ideal characteristic curve as shown at B in FIG. 4a is obtained so that the pull-in range may be increased and the erratic operation may be prevented.

Figure 5:
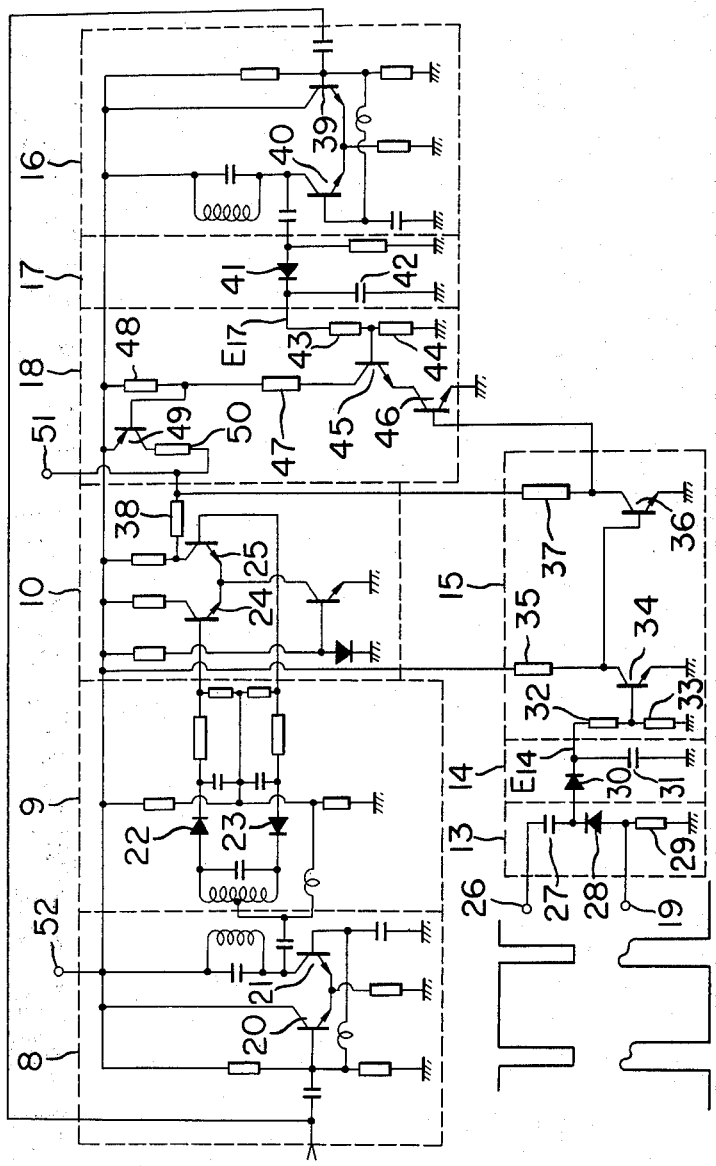
FIG. 5 is a detailed circuit diagram of the first embodiment.

Next referring to FIG. 5, the AFC device in accordance with the present invention will be described in more detail hereinafter. The tuned amplifier 8 is a differential amplifier comprising, in general, two transistors 20 and 21. The FM detector 9 is a ratio detector comprising, in general, two diodes 22 and 23. The amplifier 10 is a differential amplifier comprising, in general, two transistors 24 and 25.

An output terminal of the sync separator 12 is coupled through a capacitor 27 to the cathode of a diode 28 in the clamper 13 for clamping the sync signals. The anode of the diode 28 is grounded through a resistor 29 and is coupled to the terminal 19 to which are applied the horizontal flyback pulses. That is, the clamper 13 is made up of the capacitor 27, the clamping diode 28 and the resistor 29.

The cathode of the clamping diode 28 of the clamper 13 is coupled to the anode of a sync signal detecting diode 30 in the peak detector 14, and the cathode of the diode 30 is grounded through a capacitor 31. The cathode of the diode 30 is connected through a resistor 32 to the base of a transistor 34 in the first switching circuit 15. The base of the transistor 34 is grounded through a resistor 33 while the emitter, grounded directly, and the collector is connected through a resistor 35 to a DC power source terminal 52 and to the base of a transistor 36. The emitter thereof is grounded while the collector is coupled through resistors 37 and 38 to the collector of the transistor 25 in the amplifier 10. In summary, the first switching circuit 15 is made up of the transistors 34 and 36, and their associated resistors 32, 33, 35 and 37.

The sync signals applied to the terminal 26 are coupled through the capacitor 27 to the clamping diode 28 so that they are clamped by the horizontal flyback pulses applied to the terminal 19. The waveforms of the voltage at the cathode of the clamping diode 28 are shown in FIG. 6a and 6b. That is, FIG. 6a shows the waveform when the oscillation frequency $f_{LO}$ of the local oscillator 11 is maintained at the reference frequency or deviates to a lower frequency while FIG. 6b, the waveform when the local oscillation frequency $f_{LO}$ deviates to a higher frequency by more than 1 MHz. When the output voltage with the waveform as shown in FIG. 6a of the clamper 13 is detected by the peak detector, a high DC voltage is obtained while when the output voltage with the waveform as shown in FIG. 6b is detected, a low DC voltage output is derived. In response to the high DC output voltage of the peak detector 14, the transistor 34 in the first switching circuit 15 is turned on while the transistor 36 is turned off. Therefore, the AFC output voltage, that is the collector voltage of the transistor 25 in the amplifier 10 is coupled through the resistor 38 and an output terminal 51 to the varactor diode in the local oscillator 11 (see FIG. 3) so that the local oscillation frequency may be maintained at prescribed frequency.

When the peak detector 14 gives a low DC output voltage to the first switching circuit 15, the transistor 34 is turned off while the transistor 36 is turned on so that the AFC output voltage, that is the output of the transistor 25 in the amplifier 10, is divided by the voltage divider consisting of the resistors 37 and 38. Therefore, the output voltage E1 is derived as shown in FIG. 4a, and is applied to the varactor in the local oscillator 11. Thus, in response to the sync signals, the AFC output voltage is controlled so that the waveform indicated by the solid lines B in FIG. 4a may be obtained.

The tuned amplifier 16 comprises, in general, two transistors 39 and 40, and the detector 17, a diode 41 and a capacitor 42. The cathode of the diode 41 is grounded through a series circuit of resistors 43 and 44 whose junction is coupled to the base of a transistor 45 in the second switching circuit 18. The emitter of the transistor 45 is coupled to the collector of a transistor 46 whose emitter is grounded and whose base is coupled to the collector of the transistor 36 in the first switching circuit 15. The collector of the transistor 45 is coupled through resistors 47 and 48 to the DC power source terminal 52. The junction between the resistors 47 and 48 is coupled to the base of a transistor 49 in the second switching circuit 18. The emitter of the transistor 49 is coupled to the terminal 52 while the collector is coupled through a resistor 50 to the junction between the resistors 37 and 38.

The tuned amplifier 16 gives the sound carrier output of 57.25 MHz of the next channel to the detector 17 in the next stage so that the output whose waveform as shown in FIG. 4c is obtained. When the local oscillator frequency is slow or deviates to a lower frequency by −1.5 MHz, it tends to pull in the sound carrier of the next channel. However, the output voltage E17 is derived from the detector 17 so tat both the transistors 45 and 46 in the second switching circuit 18 are turned on. The transistor 49 is also turned on. As a result, the output voltage, which appears at the output terminal 51, is raised so that the waveform or inversed S-shaped output voltage may be corrected as shown at A in FIG. 4a. Therefore, the frequency of the received TV signal is pulled in by the video carrier, and is prevented from being pulled in by the sound carrier of the next channel. When the local oscillator frequency is high or deviates to a higher frequency, all of the transistors 45, 46, and 49 in the second switching circuit 18 are turned off.

I claim:

1. An automatic frequency control device for a television receiver comprising
   a. a mixer for mixing a received TV signal with the output of a local oscillator,
   b. said local oscillator coupling its output of a predetermined oscillation frequency to said mixer,
   c. a video intermediate frequency amplifier for amplifying the output of said mixer,
   d. an FM detector for detecting the output of said video intermediate frequency amplifier, the S-shaped output voltage of said FM detector being coupled to said local oscillator so as to automatically correct the oscillation frequency thereof,
   e. means connected to said video intermediate amplifier and bypassing said FM detector for detecting the signal with a frequency equal to the video intermediate frequency minus the difference between said video intermediate frequency and the sound intermediate frequency of the adjacent receiving channel, and
   f. means for correcting said S-shaped output voltage in response to the output of said detecting means so as to prevent the pull-in of the sound carrier of the adjacent receiving channel.

2. An automatic frequency control device as defined in claim 1 further comprising
   a. video detector means connected to said video intermediate frequency amplifier for detecting said received TV signal,
   b. synchronizing signal separating means connected to said video detector means for separating and for deriving synchronizing signal from a video signal in said received TV signal,
   c. means for detecting the sync signals in said received TV signal,
   d. synchronizing signal clamping means connected to said sync signal separating means for clamping the sync signal derived from the sync separating means by horizontal flyback pulses, and
   e. means for correcting, in response to the output of said sync signal detecting means, said S-shaped output voltage so as to increase the pull-in range, said corrected S-shaped output voltage comprising an AFC voltage.

3. An automatic frequency control device for a television receiver comprising
   a. a mixer for mixing the received TV signal with the output of a local oscillator,
   b. said local oscillator coupling its output of a predetermined oscillation frequency to said mixer,
   c. a video intermediate frequency amplifier for amplifying the output of said mixer,
   d. an FM detector for detecting the output of said video intermediate frequency amplifier, the S-shaped voltage output of said FM detector being coupled to said local oscillator so as to control automatically the oscillation frequency of said local oscillator,
   e. a clamping circuit, consisting of a capacitor, a clamping diode and a resistor serially connected, for clamping the sync signals by horizontal flyback pulses,
   f. a peak detector for detecting the peak voltage of the output of said clamping circuit, and
   g. means for correcting, in response to the output of said sync signal detecting means, said S-shaped voltage output so as to increase the pull-in range.

4. An automatic frequency control device as defined in claim 3 further comprising
   a. a switching circuit consisting of two transistors, and a plurality of resistors connected thereto, in which said switching circuit is connected to said peak detector, and is adapted to be turned on or off in response to the output of said sync signal detecting means, and
   b. a voltage divider consisting of two resistors, in which said voltage divider is coupled to said switching circuit for dividing the output of said FM detector, whereby an AFC voltage may be controlled in response to said switching circuit.

5. An automatic frequency control device as defined in claim 1 further comprising
   a tuned amplifier connected to the output of the video intermediate frequency amplifier for tuning the tuning frequency of the tuned amplifier equal to the video intermediate frequency minus the difference between said video intermediate frequency and the sound intermediate frequency of the adjacent receiving channel,
   b. a detector for detecting the output of said tuned amplifier, and
   c. a switching circuit connected to said detector and adapted to be turned on or off in response to the output of said detector, a differential amplifier connected to the output of said switching circuit for supplying an AFC correcting voltage derived from the output of said FM detector to the local oscillator, wherein said switching circuit is turned on only when the oscillation frequency of the local oscillator deviates over a predetermined value.

6. An automatic frequency control device as defined in claim 2 further comprising a. a first switching circuit adapted to be turned on or off in response to the output signal of said sync signal detecting means, b. a voltage divider consisting of at least two resistors which are coupled to said first switching circuit and to the differential amplifier respectively for dividing the output of said FM detector, whereby the AFC voltage may be controlled in response to said first switching means, and c. a second switching circuit adapted to be turned on or off in response to the output of said frequency detecting means, the output of said second switching circuit when the latter is turned on being applied to the output voltage of said FM detector so as to correct the latter, said second switching circuit being turned off when the output of said FM detector is divided by said voltage divider coupled to said first switching circuit.

* * * * *